US008277161B2

(12) United States Patent
Aburatani et al.

(10) Patent No.: US 8,277,161 B2
(45) Date of Patent: Oct. 2, 2012

(54) SUBSTRATE PROCESSING APPARATUS AND MANUFACTURING METHOD OF A SEMICONDUCTOR DEVICE

(75) Inventors: Yukinori Aburatani, Toyama (JP); Seiyo Nakashima, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 490 days.

(21) Appl. No.: 12/213,679

(22) Filed: Jun. 23, 2008

(65) Prior Publication Data
US 2009/0003977 A1    Jan. 1, 2009

(30) Foreign Application Priority Data

Jun. 26, 2007    (JP) ................................ 2007-167532

(51) Int. Cl.
*H01L 21/677*    (2006.01)

(52) U.S. Cl. ......... 414/217; 414/805; 414/935; 414/940
(58) Field of Classification Search .................. 414/217, 414/217.1, 331.02, 805, 935, 940
See application file for complete search history.

(56) References Cited

U.S. PATENT DOCUMENTS

| | | | |
|---|---|---|---|
| 6,439,822 B1 * | 8/2002 | Kimura et al. | 414/331.04 |
| 6,547,660 B1 * | 4/2003 | Suenaga et al. | 454/187 |
| 6,579,052 B1 * | 6/2003 | Bonora et al. | 414/222.01 |
| 6,582,174 B1 * | 6/2003 | Hayashi | 414/217 |
| 7,134,825 B1 * | 11/2006 | Schmutz et al. | 414/217.1 |
| 7,700,156 B2 * | 4/2010 | Aoki et al. | 427/248.1 |
| 2002/0009383 A1 * | 1/2002 | Kawaura et al. | 420/418 |
| 2003/0065471 A1 * | 4/2003 | Tsuji et al. | 702/130 |
| 2003/0113190 A1 * | 6/2003 | Bachrach | 414/217 |
| 2004/0037675 A1 * | 2/2004 | Zinger et al. | 414/217 |
| 2007/0148606 A1 * | 6/2007 | Nakajima et al. | 432/77 |
| 2007/0258796 A1 * | 11/2007 | Englhardt et al. | 414/217 |

FOREIGN PATENT DOCUMENTS

| | | |
|---|---|---|
| JP | A-03-225847 | 10/1991 |
| JP | A-2000-216212 | 8/2000 |
| JP | A-2003-273038 | 9/2003 |

* cited by examiner

*Primary Examiner* — Scott Lowe
(74) *Attorney, Agent, or Firm* — Oliff & Berridge, PLC

(57) ABSTRACT

A substrate processing apparatus is equipped with a processing furnace for processing wafers, a loading port which is used for carrying a pod containing substrates into and out of a case, a pod transport mechanism for transporting the container at least from the entrance and exit place, and a top storage which is disposed above the processing furnace in such a manner that at least part of the top storage overlaps with the processing furnace in the direction of gravity.

22 Claims, 13 Drawing Sheets

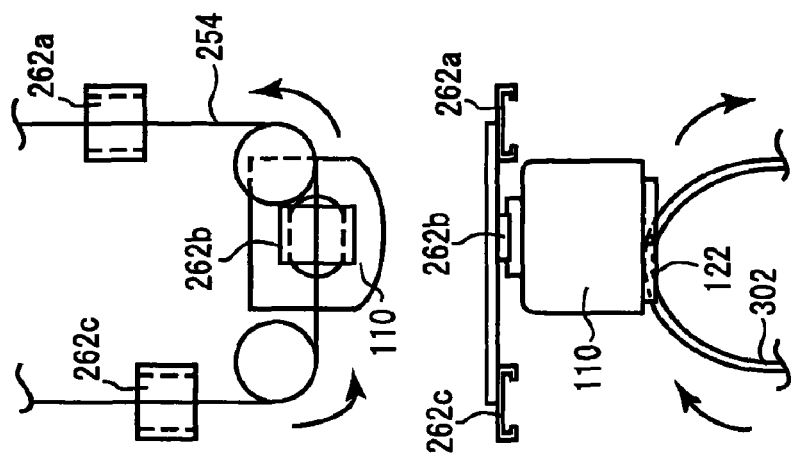
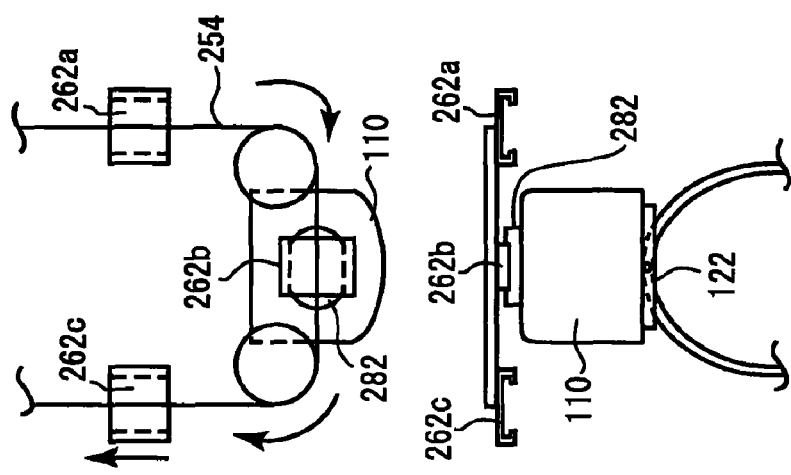
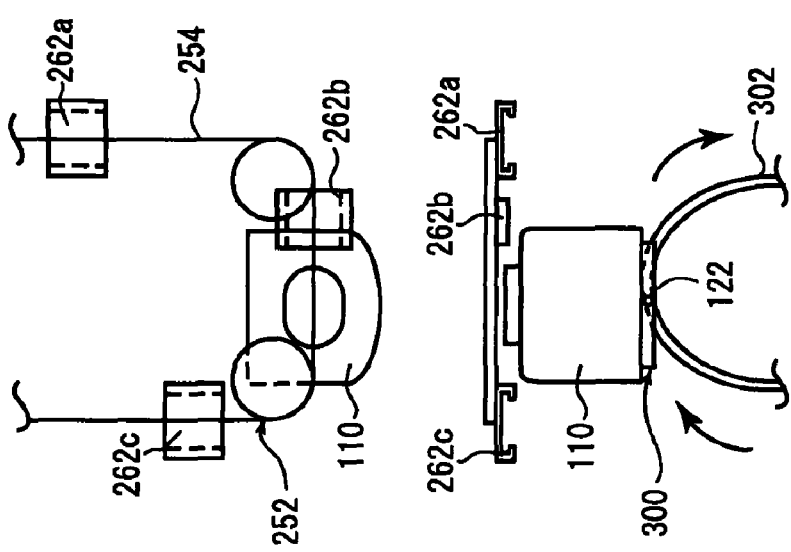

SUBSTRATE PROCESSING APPARATUS AND MANUFACTURING METHOD OF A SEMICONDUCTOR DEVICE

BACKGROUND OF THE INVENTION

1. Field of the Invention

The present invention relates to a substrate processing apparatus for processing substrates such as semiconductor wafers and a manufacturing method of a semiconductor device.

2. Description of the Related Art

As disclosed in JP-A-2000-216212, a technique relating to a substrate processing apparatus is known in which containers each of which contains plural substrates are housed in a substrate processing apparatus body. In this technique, containers are disposed under or beside a processing furnace for processing substrates.

However, the above technique has problems that containers cannot be housed in a large number in the substrate processing apparatus body and that the substrate processing apparatus needs to be increased in size if it is intended to house a large number of containers.

SUMMARY OF THE INVENTION

An object of the present invention is to provide a substrate processing apparatus capable of suppressing its size increase while increasing the number of containers that can be housed in a substrate processing apparatus body.

The invention provides a substrate processing apparatus comprising a processing furnace for processing substrates; an entrance and exit place which is used for carrying a container containing a substrate or substrates into and out of a substrate processing apparatus body; a transport mechanism for transporting the container at least from the entrance and exit place; and a storage capable of exchanging the container with the transport mechanism, for storing containers, the storage being disposed above the processing furnace in such a manner that at least part of the storage overlaps with the processing furnace in a direction of gravity.

The invention can provide a substrate processing apparatus capable of suppressing its size increase while increasing the number of containers that can be housed in a substrate processing apparatus body.

BRIEF DESCRIPTION OF THE DRAWINGS

FIGS. 11A-11C show a vertical moving mechanism and a horizontal moving mechanism used in the fourth embodiment, and illustrate a state that a pod is about to arrive at a position of delivery from the vertical moving mechanism to the horizontal moving mechanism, a state that the pod is being delivered from the vertical moving mechanism to the horizontal moving mechanism, and a state immediately after the delivery of the pod from the vertical moving mechanism to the horizontal moving mechanism;

DETAILED DESCRIPTION OF THE INVENTION

Figure 1:
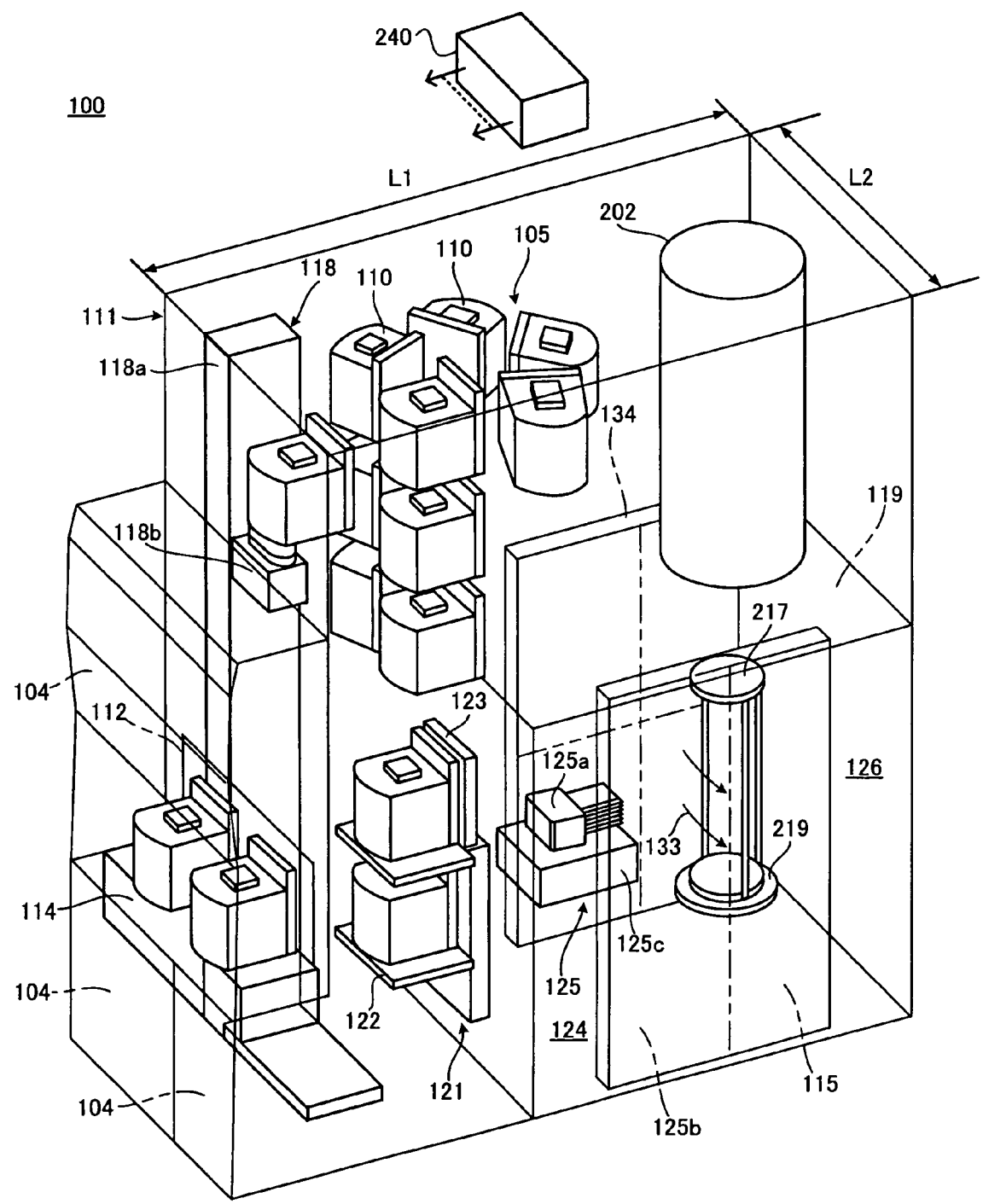
FIG. 1 is a perspective view of a substrate processing apparatus according to a first embodiment of the present invention.
Figure 2:
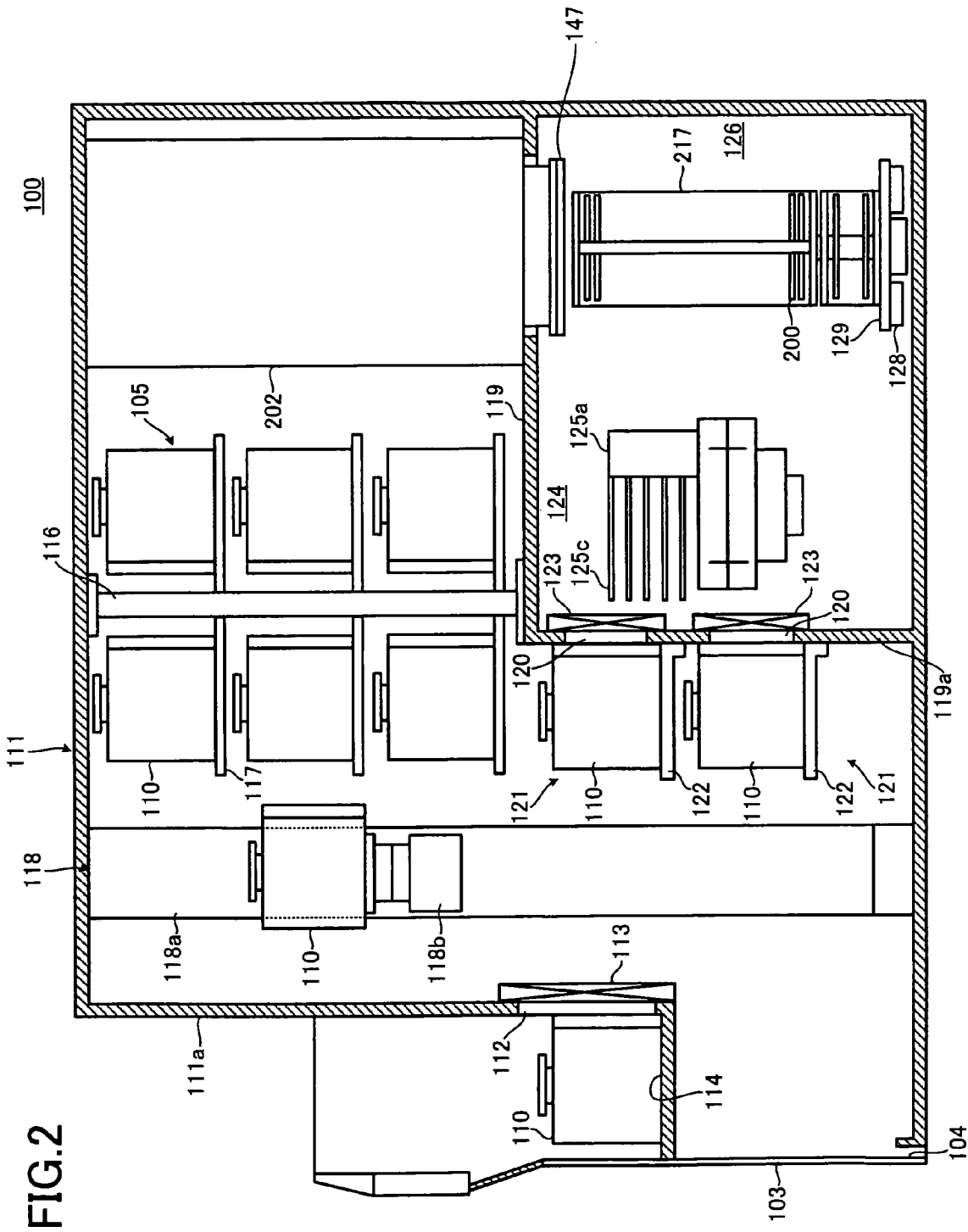
FIG. 2 is a see through side view of the substrate processing apparatus of FIG. 1.

Embodiments of the present invention will be hereinafter described with reference to the drawings. For example, substrate processing apparatus according to the embodiments of the invention are semiconductor manufacturing apparatus as processing apparatus for a manufacturing method of a semiconductor device (IC). The following description will be directed to substrate processing apparatus that are vertical apparatus which perform oxidation, diffusion processing, CVD processing, etc. on substrates. FIG. 1 is a perspective view of a substrate processing apparatus according to a first embodiment of the invention. FIG. 2 is a see through side view of the substrate processing apparatus of FIG. 1.

As shown in FIGS. 1 and 2, a substrate processing apparatus 100 using hoops (hereinafter referred to as "pods") 110 as wafer carriers (containers) each of which contains plural wafers (substrates) 200 such as silicon wafers is equipped with a case 111 which is a substrate processing apparatus body. The case 111 generally has a rectangular parallelepiped shape and its length L1 in the longitudinal direction is greater than its length L2 in the shorter-side direction which is perpendicular to the longitudinal direction.

A front maintenance opening 103 is formed in front of a front wall 111a of the case 111 to enable maintenance, and front maintenance doors 104 for opening or closing the front maintenance opening 103 are attached.

A pod entrance and exit opening (substrate container entrance and exit opening) 112 is formed in the front wall 111a of the case 111 so that the inside and the outside of the case can communicate with each other. The pod entrance and exit opening 112 can be opened or closed by a front shutter (substrate container entrance and exit opening opening and closing mechanism) 113.

A loading port (substrate container delivery stage) 114 to serve as an entrance and exit place (entrance and exit stage) is disposed in front of the pod entrance and exit opening 112. The loading port 114 is configured so that pods 110 are positioned when mounted thereon. Pods 110 are carried onto or away from the loading port 114 by an intra-process transport apparatus (not shown).

A rotary pod rack (substrate container rack) 105 is disposed in the case 111 at a top position (approximately at the center in the front-rear direction) and is configured so as to store plural pods 110. More specifically, the rotary pod rack 105 is equipped with a support pole 116 which erects vertically and is rotated intermittently about its axis and plural shelf boards (substrate container mounting boards) 117 which are supported by the support pole 116 at top, middle, and bottom positions so as to be arranged radially. Each of the shelf board 117 is configured so as to support one pod 110 mounted thereon.

A pod transport apparatus (substrate container transport apparatus) 118 is disposed between the loading port 114 and the rotary pod rack 105 in the case 111. The pod transport apparatus 118 is composed of a pod elevator (substrate container elevation mechanism) 118*a* capable of elevating or lowering a pod 110 while holding it and a pod transport mechanism (substrate container transport mechanism) 118*b*. The pod transport apparatus 118 transports a pod 110 between the loading port 114, the rotary pod rack 105, and pod openers (substrate container lid opening and closing mechanisms) 121 as the pod elevator 118*a* and the pod transport mechanism 118*b* operate sequentially.

A sub-case 119 is constructed in the case 111 so as to occupy a bottom-rear space of the case 111 and to be adjacent to the rear wall of the case 111 over its length in the right-left direction. A pair of wafer entrance and exit openings (substrate entrance and exit openings) 120 through which to bring wafers 200 into or out of the sub-case 119 are formed in a front wall 119*a* of the sub-case 119 so as to be arranged in the vertical direction. Two pod openers 121 are provided for the top and bottom wafer entrance and exit openings 120, respectively. Each pod opener 121 is equipped with a stage 122 to be mounted with a pod 110 and a cap attaching and detaching mechanism (lid attaching and detaching mechanism) 123 for attaching or detaching a cap (lid, sealing member) of a pod 110. Each pod opener 121 is configured so as to open or close a wafer input and output opening of a pod 110 by attaching or detaching the cap of the pod 110 mounted on the stage 122 with the cap attaching and detaching mechanism 123.

The sub-case 119 constitutes a transfer room 124 which is isolated fluid-tightly from the space in which the pod transport apparatus 118 and the rotary pod rack 105 are installed. A wafer transfer mechanism (substrate transfer mechanism) 125 is disposed in the transfer room 124 at a front position. The wafer transfer mechanism 125 is composed of a wafer transfer apparatus (substrate transfer apparatus) 125*a* capable of rotating wafers 200 or moving them straightly in horizontal planes and a wafer transfer apparatus elevator (substrate transfer apparatus elevation mechanism) 125*b* for elevating or lowering the wafer transfer apparatus 125*a*. As schematically shown in FIG. 1, the wafer transfer apparatus elevator 125*b* is disposed between the right-hand wall of the pressure-resistant case 111 and a front-right space of the transfer room 124 of the sub-case 119. As the wafer transfer apparatus elevator 125*b* and the wafer transfer apparatus 125*a* operate sequentially, wafers 200 are charged into or discharged from a boat (substrate holding device) 217 with tweezers (substrate holding members) 125*c* of the wafer transfer apparatus 125*a* serving as members mounted with the wafers 200.

A standby space 126 where the boat 217 is to stand by is formed as a rear space of the transfer room 124. A processing furnace 202 which serves as a processing chamber is disposed over the standby space 126. A bottom portion of the processing furnace 202 is opened or closed by a furnace entrance shutter (furnace entrance opening and closing mechanism) 147.

As schematically shown in FIG. 1, a boat elevator (substrate holding device elevation mechanism) 115 for elevating or lowering the boat 217 is disposed between the right-hand wall of the pressure-resistant case 111 and a right-hand part of the standby space 126 of the sub-case 119. A sealing cap (lid) 219 is horizontally attached to arms 128 (connecting members) which are connected to an elevation stage of the boat elevator 115. The sealing cap 219 is configured so as to be able to support the boat 217 standing vertically and to close the bottom portion of the processing furnace 202.

Equipped with plural holding members, the boat 217 can hold plural (e.g., 50 to 125) wafers 200 in such a manner that the wafers 200 are oriented horizontally and arranged in the vertical direction with their centers aligned.

As schematically shown in FIG. 1, to supply a clean gas 133 such as cleaned air or an inert gas, a cleaning unit 134 which is composed of a supply fan and a dust filter is disposed in the transfer room 124 on the left side which is opposite to the side where the wafer transfer apparatus elevator 125*b* and the boat elevator 115 are disposed. A notch setting device (not shown) as a substrate registration device for registering wafers 200 in the circumferential direction is disposed between the wafer transfer apparatus 125*a* and the cleaning unit 134.

Clean gas 133 which is blown out of the cleaning unit 134 passes the notching setting device, the wafer transfer apparatus 125*a*, and the boat 217 located in the standby space 126, sucked into a duct (not shown), and exhausted from the case 111. Alternatively, the clean gas 134 is circulated to the primary side (supply side, suction side) of the cleaning unit 134 and again blown into the transfer room 124 by the cleaning unit 134.

Next, the operation of the substrate processing apparatus 100 will be described. In the following description, it is assumed that operation of each of the apparatus, devices, etc. constituting the substrate processing apparatus 100 is controlled by a controller 240. As shown in FIGS. 1 and 2, when a pod 110 is supplied to the loading port 114, the pod entrance and exit opening 112 is opened by the front shutter 113 and the pod 110 on the loading port 114 is brought into the case 111 through the pod entrance and exit opening 112 by the pod transport apparatus 118.

The pod 110 thus brought in is automatically transported by the pod transport apparatus 118 so as to be delivered to a specified shelf board 117 of the rotary pod rack 105, stored there temporarily, transported and delivered from the shelf board 117 to one of the pod openers 121, and mounted on the stage 122. Or the pod 110 is directly transported to one of the pod openers 121 and mounted on the stage 122. At this time, the wafer entrance and exit opening 120 of the pod opener 121 is closed by the cap attaching and detaching mechanism 123 and the transfer room 124 is filled with a clean gas 133. For example, the transfer room 124 is filled with a clean gas 133 which is a nitrogen gas, whereby the oxygen concentration is set at 20 ppm or less, that is, slightly lower than in the case 111 (air atmosphere).

The opening-side end face of the pod 110 which is mounted on the stage 122 is pressed against the periphery of the wafer entrance and exit opening 120 of the front wall 119*a* of the sub-case 119, and its cap is removed by the cap attaching and detaching mechanism 123 and the wafer input and output opening is opened.

When the pod 110 has been opened by the pod opener 121, wafers 200 are picked up by the tweezers 125*c* of the wafer transfer apparatus 125*a* through the wafer input and output opening. Then, the wafers 200 are registered by the notch setting device (not shown), carried to the standby space 126 which is the rear space of the transfer room 124, and charged into the boat 217. The wafer transfer apparatus 125*a* which has delivered the wafers 200 to the boat 217 returns to the pod 110 and carries next wafers 200 and charges them into the boat 217.

While the wafers 200 are being carried from the one (top or bottom one) of the pod openers 121 and charged into the boat 217 by the wafer transfer mechanism 125, another pod 110 is transported from the rotary pod rack 105 to the other (bottom or top) pod opener 121 by the pod transfer apparatus 118 and opened by the other pod opener 121.

When a pre-specified number of wafers 200 have been charged into the boat 217, the bottom portion of the processing furnace 202 that has been closed by the furnace entrance shutter 147 is opened by the furnace entrance shutter 147. Then, the boat 217 which holds the wafers 200 is loaded into the processing furnace 202 as the sealing cap 219 is elevated by the boat elevator 115.

After the boat 217 has been loaded, arbitrary processing is performed on the wafers 200 in the processing furnace 202.

After the wafers 200 have been processed, the wafers 200 and the pod 110 are output from the case 111 according to a procedure that is reverse to the above-described procedure except for the wafer registration which is performed by the notch setting device (not shown).

Figure 3:
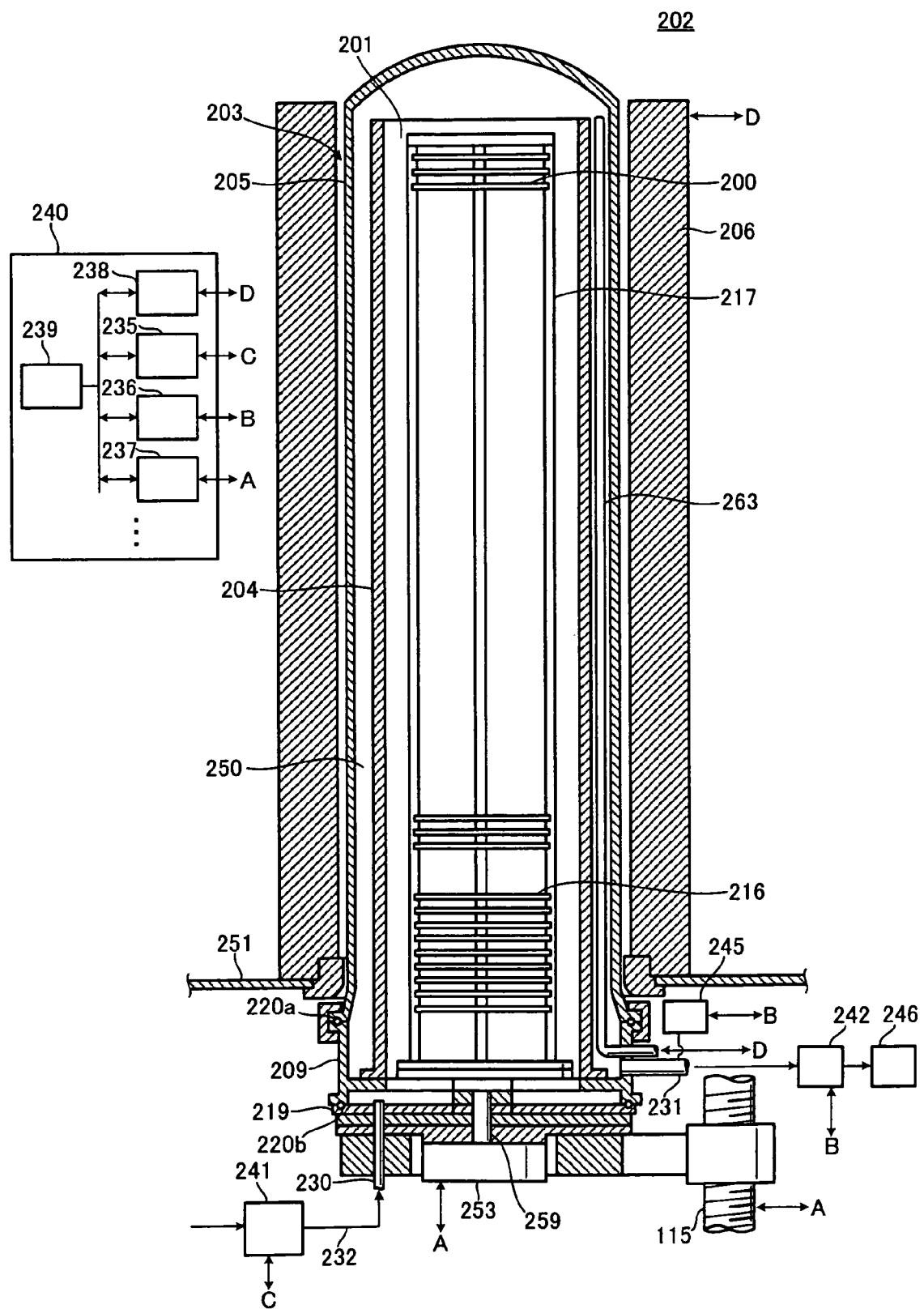
FIG. 3 is a sectional view of a processing furnace of the substrate processing apparatus of FIG. 1.

FIG. 3 shows the processing furnace 202. As shown in FIG. 3, the processing furnace 202 has a heater 206 as a heating mechanism. The heater 206 has a cylindrical shape and is installed vertically being supported by a heater base 251 as a holding plate.

A process tube 203 as a reaction tube is disposed inside the heater 206 so as to be concentric with the heater 206. The process tube 203 is composed of an inner tube 204 as an inner reaction tube and an outer tube 205 as an outer reaction tube which is disposed outside the inner tube 204. The inner tube 204 is made of a heat-resistant material such as quartz ($SiO_2$) or silicon carbide (SiC) and has a cylindrical shape that is open at the top and the bottom. A processing chamber 201 is formed as a cylindrical empty space in the inner tube 204 so as to be able to house wafers (substrates) 200 that are oriented horizontally and arranged in the vertical direction in the boat 217. The outer tube 205 is made of a heat-resistant material such as quartz or silicon carbide, its inner diameter is larger than the outer diameter of the inner tube 204, and is concentric with the inner tube 204. The outer tube 205 has a cylindrical shape that is closed at the top and open at the bottom.

A manifold 209 is disposed under the outer tube 205 so as to be concentric with the outer tube 205. The manifold 209 is made of stainless steel, for example, and has a cylindrical shape that is open at the top and the bottom. The manifold 209 is engaged with and supports the inner tube 204 and the outer tube 205. An O-ring 220a as a sealing member is provided between the manifold 209 and the outer tube 205. The manifold 209 is supported by the heater base 251, whereby the process tube 203 stands vertically. The process tube 203 and the manifold 209 constitute a reaction container. In this embodiment, the heater 206 is not provided with a ceiling at the top and its highest position is lower than that of the outer tube 205. However, alternatively, the heater 206 may be provided with a ceiling that covers the top portion of the outer tube 205 in such a manner that the top position of the ceiling is higher than that of the outer tube 205. In this case, the top of the ceiling of the heater 206 is the top of the processing furnace 202.

A nozzle 230 as a gas introduction member is connected to the sealing cap 219 (described later) so as to communicate with the processing chamber 201, and a gas supply pipe 232 is connected to the nozzle 230. A process gas supply source and an inert gas supply source (neither shown) are connected, via an MFC (mass flow controller) 241 as a gas flow rate control device, to the gas supply pipe 232 on its upstream side that is opposite to the side where the nozzle 230 is connected. A gas flow rate control section (gas flow rate controller) 235 is electrically connected to the MFC 241 and controls it with prescribed timing so that gas is supplied at a desired flow rate.

The manifold 209 is provided with an exhaust pipe 231 for exhausting an atmosphere in the processing chamber 201. The exhaust pipe 213 is disposed at the bottom of a cylindrical space 250 formed between the inner tube 204 and the outer tube 205 and communicates with the cylindrical space 250. A pressure sensor 245 as a pressure detection device is connected to the exhaust pipe 231 and a vacuum exhaust apparatus 246 such as a vacuum pump is also connected to the exhaust pipe 231 via a pressure regulator 242, on its downstream side that is opposite to the side where the manifold 209 is connected, whereby vacuum exhausting can be performed so that the pressure in the processing chamber 201 becomes a prescribed value (i.e., a desired degree of vacuum is obtained). A pressure control section (pressure controller) 236 is electrically connected to the pressure regulator 242 and the pressure sensor 245, and controls the pressure regulator 242 with desired timing on the basis of a pressure detected by the pressure sensor 245 so that the pressure in the processing chamber 201 becomes a prescribed value.

The sealing cap 219 as a furnace entrance lid capable of closing the bottom opening of the manifold 209 air tightly is provided under the manifold 209. The sealing cap 219 is brought into contact with the bottom end of the manifold 209 from below in the vertical direction. The sealing cap 219 is made of a metal such as stainless steel and has a disc shape. An O-ring 220b as a sealing member is provided on the top surface of the sealing cap 219 so as to be brought into contact with the bottom end of the manifold 209. A rotation mechanism 253 for rotating the boat 217 is provided on the opposite side of the sealing cap 219 to the processing chamber 201. A rotary shaft 259 of the rotation mechanism 253 penetrates through the sealing cap 219 and is connected to the boat 217 (described later). The rotary shaft 259 rotates the wafers 200 by rotating the boat 217. The sealing cap 219 is elevated or lowered in the vertical direction by the boat elevator 115 as an elevation mechanism which is disposed outside the process tube 203 so as to extend vertically, whereby the boat 217 can be brought into and out of the processing chamber 201. A drive control section (drive controller) 237 is electrically connected to the rotation mechanism 253 and the boat elevator 115, and controls them with desired timing so that they operate in desired manners.

The boat 217 as a substrate holding device is made of a heat-resistant material such as quartz or silicon carbide, and is configured so as to hold plural wafers 200 in such a manner that the wafers 200 are oriented horizontally and arranged in plural stages in the vertical direction with their centers aligned. To make heat radiated form the heater 206 less prone to reach the manifold 209 side, plural disc-shaped heat insulation plates 216 as heat insulation members which are made of a heat-resistant material such as quartz or silicon carbide are disposed in such a manner that they are oriented horizontally and arranged in plural stages in the vertical direction.

A temperature sensor 263 as a temperature detection device is disposed in the process tube 203. A temperature control section 238 is electrically connected to the heater 206 and the temperature sensor 263. The temperature control section 238 controls the degree of energization of the heater 206 with desired timing on the basis of temperature information detected by the temperature sensor 263 so that the temperature in the processing chamber 201 has a prescribed distribution. The temperature sensor 263 is equipped with a temperature switch (not shown) which is activated when the temperature has become higher than a prescribed value.

A coolant main pipe (not shown) is disposed around the processing chamber 201. The coolant main pipe is provided with a flow switch (not shown) which is activated when the coolant flow rate becomes lower than a prescribed value, a water cooling radiator (not shown), and a water cooling thyristor (not shown). Each of the water cooling radiator and the water cooling thyristor is provided with a temperature switch (not shown) which is activated when the temperature has become higher than a prescribed value.

The gas flow rate control section 235, the pressure control section 236, the drive control section 237, and the temperature control section 238 constitute an operating section and an input and output section and are electrically connected to a main control section (main controller) 239 which controls the entire substrate processing apparatus 100. The gas flow rate control section 235, the pressure control section 236, the drive control section 237, the temperature control section 238, and the main control section 239 constitute a controller 240.

Next, a description will be made of a method for forming thin films on wafers 200 by CVD using the above-configured processing furnace 202 in one step of a manufacturing process of a semiconductor device. In the following description, it is assumed that operation of each of the apparatus, devices, etc. constituting the substrate processing apparatus 100 is controlled by the controller 240.

When plural wafers 200 have been mounted on the boat 217 (wafer charging), as shown in FIG. 3 the boat 217 which holds the wafers 200 is lifted up by the boat elevator 115 and brought into the processing chamber 201 (boat loading). In this state, the sealing cap 219 seals the bottom end of the manifold 209 via the O-ring 220b.

Evacuation is performed by the vacuum exhaust apparatus 246 so that the pressure in the processing chamber 201 becomes a desired value (i.e., a desired degree of vacuum is obtained). In this operation, the pressure in the processing chamber 201 is measured by the pressure sensor 245 and the pressure regulator 242 is feedback-controlled on the basis of a measured pressure. Heating is performed by the heater 206 so that the temperature in the processing chamber 201 becomes a prescribed value. In this operation, the degree of energization of the heater 206 is feedback-controlled on the basis of temperature information detected by the temperature sensor 263 so that a prescribed temperature distribution is obtained in the processing chamber 201. Then, the rotation mechanism 253 rotates the boat 217 to rotate the wafers 200.

Then, a gas that is supplied from the process gas supply source and whose flow rate is controlled to a desired value by the MFC 241 is introduced into the processing chamber 201 through the gas supply pipe 232 and the nozzle 230. The gas thus introduced goes up in the processing chamber 201, flows into the cylindrical space 250 through the top opening of the inner tube 204, and is exhausted through the exhaust pipe 231. In passing through the processing chamber 201, the gas is brought into contact with the surfaces of the wafers 200, whereby thin films are deposited on the surfaces of the wafers 200 through thermal CVD reaction.

Upon a lapse of a preset processing time, an inert gas is supplied from the inert gas supply source. The gas remaining in the processing chamber is replaced by the inert gas and the pressure in the processing chamber 201 returns to ordinary pressure.

Then, the sealing cap 219 is lowered by the boat elevator 115, whereby the bottom end of the manifold 209 is opened. The processed wafers 200 being held by the boat 217 are brought out of the process tube 203 through the bottom end of the manifold 209 (boat unloading). Then, the processed wafers 200 are taken out of the boat 217 (wafer discharging).

Exemplary sets of process conditions which are employed when wafers 200 are processed by the processing furnace 202 according to this embodiment are as follows. For formation of an SiN film (silicon nitride film), the process temperature is 400 to 800° C., the process pressure is 1 to 50 Torr, the film formation gases are $SiH_2Cl_2$ and $NH_3$, and the film formation gas flow rate is 0.02 to 0.30 slm for $SiH_2Cl_2$ and 0.1 to 2.0 slm for $NH_3$. For formation of a polysilicon film, the process temperature is 350 to 700° C., the process pressure is 1 to 50 Torr, the film formation gas is $SiH_4$, and the film formation gas flow rate is 0.01 to 1.20 slm. Wafers 200 are processed with the individual process conditions kept at certain constant values in their ranges, respectively.

Figure 4:
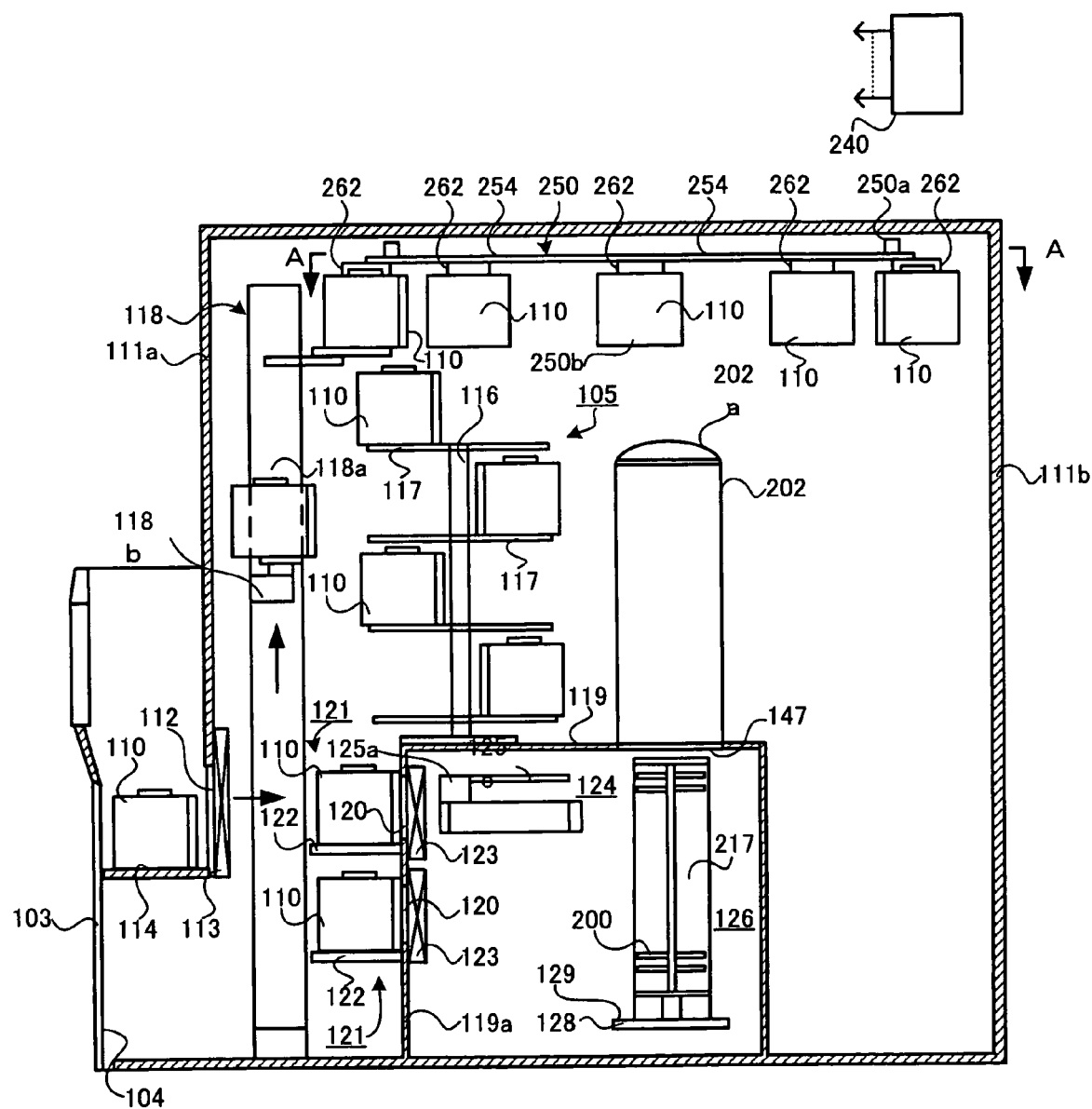
FIG. 4 is a see through side view of a substrate processing apparatus according to a second embodiment of the invention.
Figure 5:
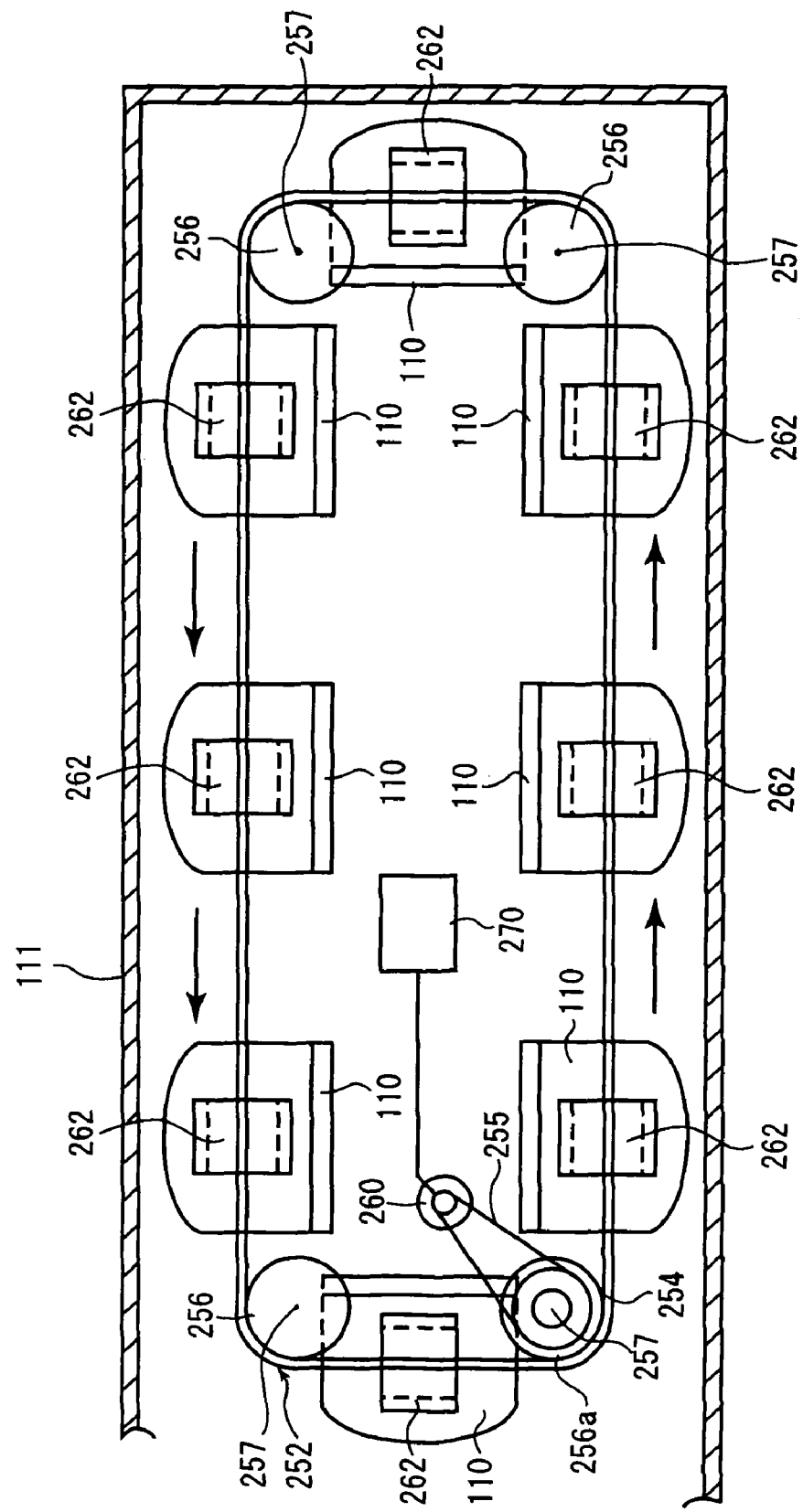
FIG. 5 is a sectional view taken along line A-A in FIG. 4.

FIGS. 4 and 5 show a second embodiment of the invention. In the above-described first embodiment of the invention, pods 110 are stored in the case 111 by means of the rotary pod rack 105. In contrast, in the second embodiment, pods 110 are stored by means of a top storage 250 in addition to the rotary pod rack 105.

The top storage 250 is disposed in such a manner that at least part of it is located above the processing furnace 202 in the case 111. More specifically, the top storage 250 is disposed in the case 111 in such a manner that its top end portions 250a are located above a top end portion 202a of the processing furnace 202 in the direction of gravity. At least part of the top storage 250 should be located above the processing furnace 202. It is preferable that the top storage 250 be disposed in such a manner that its bottom end portions 250b are located above the top end portion 202a of the processing furnace 202. The number of pods 110 stored can be increased by disposing the top storage 250 in such a manner that the top storage 250 and the processing furnace 202 overlap with each other in the direction of gravity. As shown in FIG. 5, the top storage 250 is configured so as to be able to store eight pods 110, for example. The top storage 250 may be disposed in such a manner that its bottom end portions 250b are located below the top end portion 202a of the processing furnace 202.

Since as described above the top storage 250 is disposed in such a manner that at least part of it is located above the processing furnace 202, the substrate processing apparatus 100 according to the second embodiment can increase the number of pods 110 stored in the case 111 while suppressing size increase of the case 111. Where pods 110 are stored only beside and below the processing furnace 202 as in the first embodiment, the installation area (footprint) of the substrate processing apparatus 100 necessarily increases if it is intended to increase the number of pods 110 stored in the case 111. In contrast, the second embodiment can prevent size increase of the case 111 due to increase in installation area.

The top storage 250 is equipped with a horizontal moving mechanism 252 which moves pods 110 in such a manner that their movement locus has at least a horizontal component and they circle around plural rotation centers. The horizontal moving mechanism 252 has an endless circulation member 254 such as a metal chain belt. Alternatively, the circulation member 254 may be a rubber belt. It is essential that the circulation member 254 be configured so as to circulate around plural rotation centers. The circulation member 254 is supported rotatably by plural (e.g., four) support members 256. At least one of the plural support members 256 serves as a drive power transmission member which transmits rotational drive power to the circulation member 254.

Each support member 256, which is a pulley, for example, is attached to the case 111 via a rotation shaft (not shown) and rotates together with the circulation member 254 about a rotation center 257. Among the plural support members 256, a support member 256a for transmitting drive power to the circulation member 254 receives drive power from a drive source 260 such as a motor via a drive power transmission member 255 such as a drive power transmission belt.

The top storage 250 is equipped with plural (e.g., eight) holding members 262 which serve as horizontal-moving-mechanism-side delivery members as well as top holding members. The holding members 262 are attached to the circulation member 254 from below in the direction of gravity at regular intervals. As such, each holding member 262 not only hangs a pod 110 from above in the direction of gravity but also serves to exchange a pod 110 with the pod transport mechanism 118b.

With the above-described top storage 250, the longitudinal length of the case 111 is determined so as to accommodate at least two pods 110. In the second embodiment, as shown in FIG. 5, the longitudinal length of the case 111 is determined so as to accommodate five pods 110. However, the longitudinal length of the case 111 may have another value as long as it can accommodate at least two pods 110.

The shorter-side length (i.e., the length in the direction perpendicular to the longitudinal direction) of the case 111 is determined so as to accommodate at least one pod 110. In the second embodiment, as shown in FIG. 5, the shorter-side length of the case 111 is determined so as to accommodate one pod 110. However, the shorter-side length of the case 111 may have another value as long as it can accommodate at least one pod 110.

As shown in FIG. 4, the top storage 250 is provided above the processing furnace 202 so as to extend from the side of the front wall 111a of the case 111 that is formed with the loading port (entrance and exit stage) 114 for the processing furnace 202 to the side of a rear wall 111b which is opposed to the front wall 111a and to at least reach right above the processing furnace 202. It is preferable that the top storage 250 be provided so as to directly stride the processing furnace 202.

In the above-configured horizontal moving mechanism 252, drive power from the drive source 260 is transmitted to the support member 256a via the drive power transmission member 255, whereby the support member 256a is rotated. As a result, the circulation member 254 which is supported by the support member 256a is circulated and the other support members 256 which support the circulation member 254 are also rotated. As the circulation member 254 circulates, the pods 110 being held by the holding members 262 are moved at least in the longitudinal direction of the case 111. As described above, the horizontal moving mechanism 252 of the top storage 250 moves pods 110 in such a manner that their movement locus has at least a horizontal component and they circle around plural rotation centers which are the rotation centers 257 of the respective support members 256.

The circulation direction of the circulation member 254 can be switched between the direction indicated by arrows in FIG. 5 and the direction opposite to it. This is done by a control that a control section (controller) 270 which is connected to the drive source 260 controls the rotation direction of the drive source 260. The control section 270 may be included in the controller 240 or provided separately from it.

As described above, the substrate processing apparatus 100 according to the second embodiment can store eight pods 110 in the top storage 250. That is, the number of pods 110 stored in the case 111 can be increased by eight from that of the first embodiment though the height of the case 111 is increased by a length corresponding to one pod 110. The apparatus, devices, etc. having the same ones in the first embodiment have not been described in detail by giving the former the same reference symbols as the latter in FIGS. 4 and 5.

Figure 6A:
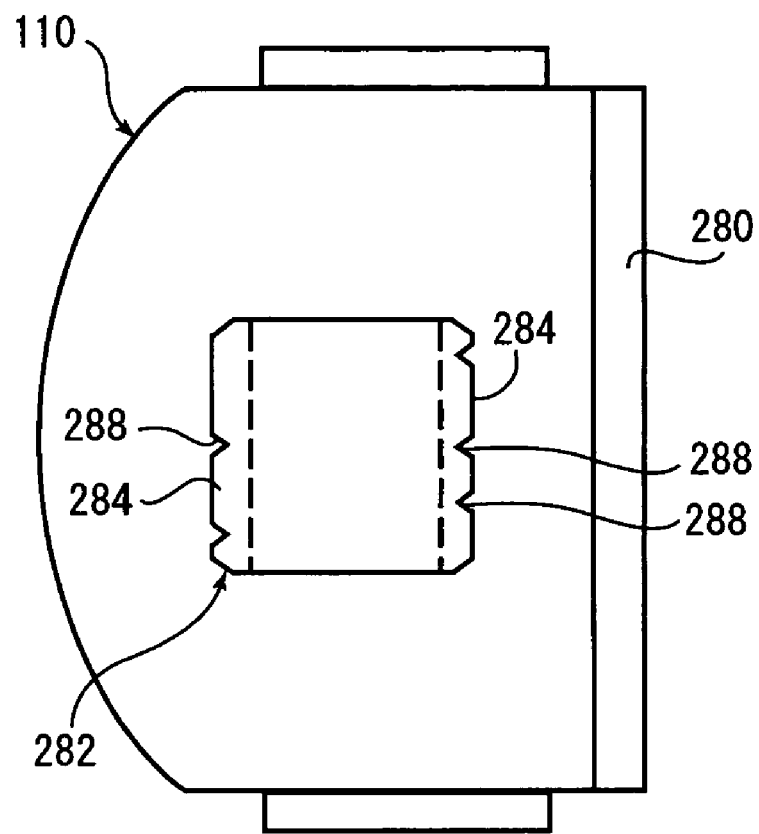
FIGS. 6A and 6B are a plan view and a side view of each pod shown in FIGS. 4 and 5.
Figure 6B:
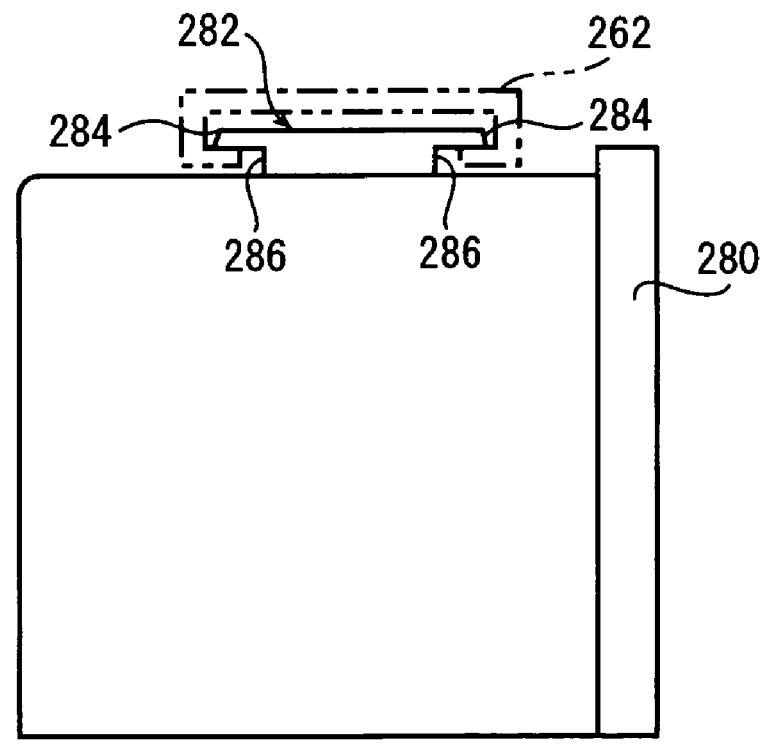

FIGS. 6A and 6B show a pod 110 used in the second embodiment. The pod 110 can accommodate plural wafers 200, and a cap 280 to serve as a sealing member for sealing the pod 110 is attached to the pod 110 in a detachable manner. A holding target member 282 to be held by a holding member 262 of the top storage 250 is attached to the top surface of the pod 110. The front portion and the rear portion of the holding target member 282 are formed with respective projections 284, and a gap 286 is formed between each projection 284 and the top surface of the pod 110. Each projection 284 is formed with plural cuts 288.

The pod 110 is held by a holding member 262 from above in the direction of gravity in such a manner that tip portions of the holding member 262 go into the respective gaps 286 (see FIG. 6B).

Figure 7A:
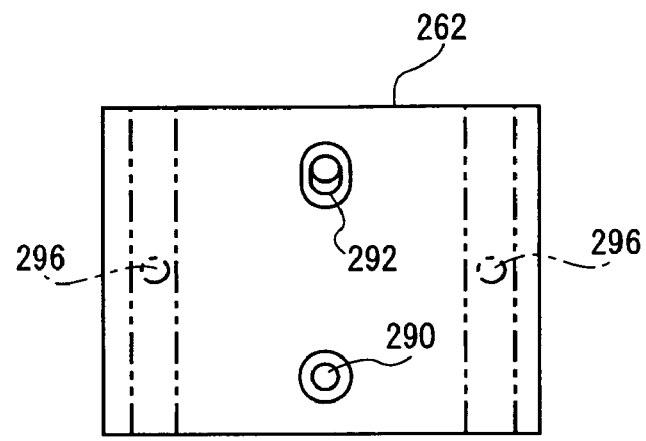
FIGS. 7A and 7B are a plan view and a side view of each holding member shown in FIGS. 4 and 5.
Figure 7B:
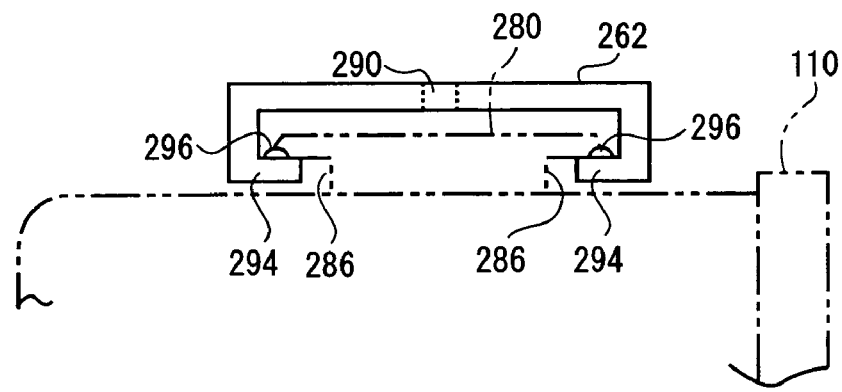

FIGS. 7A and 7B show the holding member 262. In the holding member 262, a first through-hole 290 having an approximately circular cross section and a second through-hole 292 which is an elliptical hole that is long in the right-left direction are arranged in the right-left direction. The holding member 262 is attached to the circulation member 254 (see FIG. 5) in such a manner that pins (not shown) that are attached to the circulation member 254 are inserted in the first through-hole 290 and the second through-hole 292. The holding member 262 has front and rear projections 294 each of which extends downward and is angled at a position close to its tip. A positioning pin 296 projects upward from the top surface of the tip portion of each projection 294.

As shown in FIG. 7B, the holding member 262 holds a pod 110 from above in such a manner that the projections 294 go into the respective gaps 286. The positioning pins 296 engage with cuts 288 of the holding target member 282, whereby the pod 110 is fixed to and positioned with respect to the holding member 262.

In the following description, it is assumed that operation of each of the apparatus, devices, etc. constituting the substrate processing apparatus 100 is controlled by the controller 240. In the above-configured substrate processing apparatus 100 according to the second embodiment of the invention, a pod 110 is transported from the loading port 114 by the transport mechanism 118b and delivered from the transport mechanism 118b to the top storage 250. When the wafers 200 housed therein are to be used, the pod 110 stored in the top storage 250 is delivered from the top storage 250 to the transport mechanism 118b. The transport mechanism 118b moves the pod 110 to the stage 122 of a pod opener 121. The input and output opening of the pod 110 is opened by removing the cap of the pod 110 with the cap attaching and detaching mechanism 123. The wafers 200 are taken out and transferred to the boat 217 by the wafer transfer mechanism 125. The boat 217 is, and hence the wafers 200 are, transported into the processing furnace 202 by the boat elevator 115. The wafers 200 are processed in the processing furnace 202. These operations are the same as in the above-described first embodiment and hence will not be described in detail.

Figure 8:
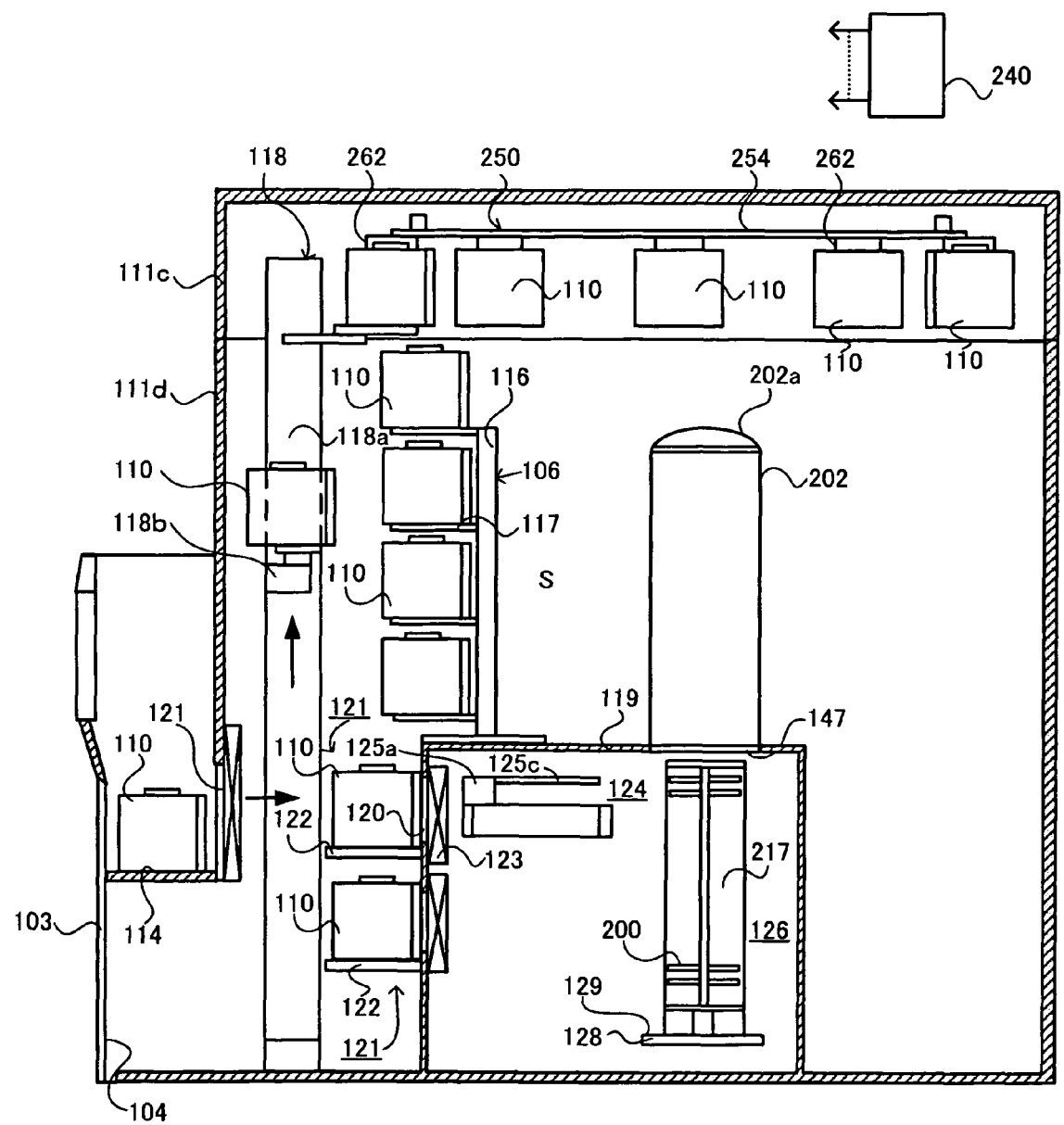
FIG. 8 is a see through side view of a substrate processing apparatus according to a third embodiment of the invention.

FIG. 8 shows a substrate processing apparatus 100 according to a third embodiment of the invention. In the substrate processing apparatus 100 according to the second embodiment, pods 110 are stored in the case 111 by using the rotary pod rack 105 and the top storage 250. In contrast, in the third embodiment, a stationary pod rack 106 is used in place of the rotary pod rack 105. That is, in the third embodiment, pods 110 are stored in the case 111 by using the stationary pod rack 106 and the top storage 250.

Like the rotary pod rack 105, the stationary pod rack 106 is configured so as to store plural pods 110. The stationary pod rack 106 is equipped with a support pole 116 and plural (e.g., five) shelf boards (substrate container mounting boards) 117 which project from the support pole 116 toward the loading port 114 side. The plural shelf boards 117 are configured so as to support pods 110 from below in the direction of gravity. The stationary pod rack 106 is fixed to the case 111 and does not rotate.

In the third embodiment, since the stationary pod rack 106 is used in place of the rotary pod rack 105, a space S in front of the processing furnace 202 which is used for storage of pods 110 in the case of the rotary pod rack 105 can be made an empty space for maintenance of the processing furnace 202.

In the third embodiment, the case 111 is composed of a top case 111c and a bottom case 111d and the top case 111c can be separated from the bottom case 111d and removed. The horizontal moving mechanism 252 etc. of the top storage 250 are disposed in the top case 111c. Therefore, in the third embodiment, if the substrate processing apparatus 100 is constructed in such a manner that the top case 111c is integral with the horizontal moving mechanism 252 etc., the bottom case 111d is given a top opening when the top case 111c is separated from the bottom case 111d.

The apparatus, devices, etc. disposed in the bottom case 111d, such as the stationary pod rack 106, can be maintained easily through the above opening. Furthermore, the substrate processing apparatus 100 may be transported (land transport or air transport) in a state that the top case 111c is separated from the bottom case 111d so as to satisfy regulations relating to load heights. The substrate processing apparatus 100 can thus be transported easily. The apparatus, devices, etc. having the same ones in the first embodiment have not been described in detail by giving the former the same reference symbols as the latter in FIG. 8.

Figure 9:
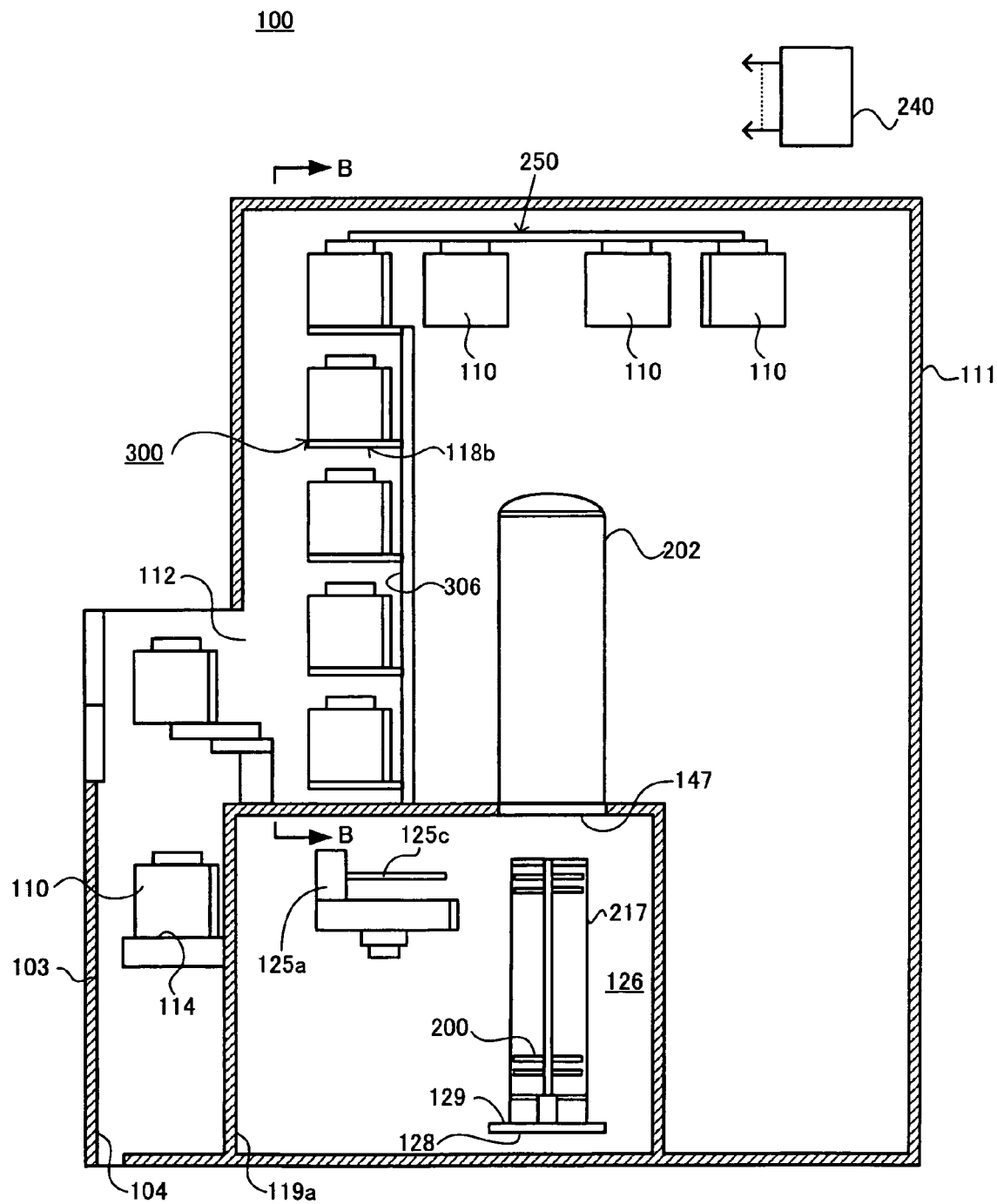
FIG. 9 is a see through side view of a substrate processing apparatus according to a fourth embodiment of the invention.
Figure 10:
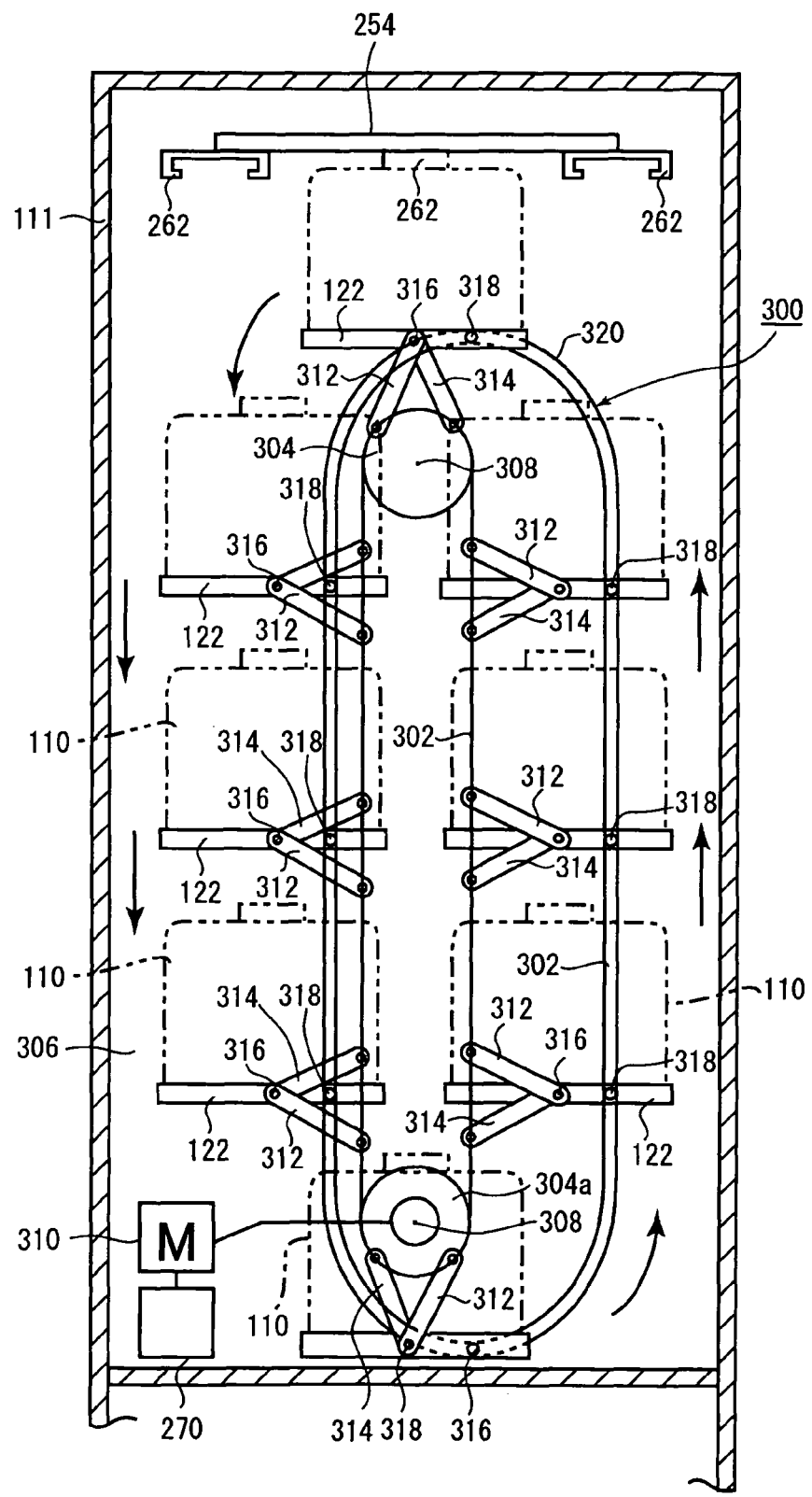
FIG. 10 is a sectional view taken along line B-B in FIG. 9.

FIGS. 9 and 10 show a substrate processing apparatus 100 according to a fourth embodiment of the invention. In the above-described first embodiment, the pod transport mechanism 118b is configured so as to move a pod 110 in the vertical direction (see FIGS. 1 and 2). In contrast, in the substrate processing apparatus 100 according to the fourth embodiment, a pod transport mechanism 118b has a vertical moving mechanism 300 which moves pods 110 in such a manner that their movement locus has at least a vertical component and they circle.

The vertical moving mechanism 300 has an endless circulation member 302 such as a metal chain belt. Alternatively, the circulation member 302 may be a rubber belt. The circulation member 302 is supported rotatably by plural (e.g., two) support members 304. At least one of the plural support members 304 serves as a drive power transmission member which transmits rotational drive power to the circulation member 302.

Each support member 304, which is a pulley, for example, is attached to a wall member 306 extending approximately in the vertical direction in the case 111 via a rotation shaft (not shown) and rotates together with the circulation member 302 about a rotation center 308. Among the plural support members 304, a support member 304a for transmitting drive power to the circulation member 302 receives drive power from a drive source 310 such as a motor via a drive power transmission member (not shown) such as a drive power transmission belt. The above-mentioned control section 270 (see FIG. 5) is connected to the drive source 310.

The vertical moving member 300 is equipped with sets of a first link member 312 and a second link member 314. One end portions of the first link member 312 and the second link member 314 are linked rotatably to a stage 122 by means of a link pin 316. The other end portions of the first link member 312 and the second link member 314 are linked rotatably to the circulation member 302. Each stage 122, which serves as a bottom support member for supporting a pod 110 from below in the direction of gravity, is formed with a projection 318 which projects rearward, that is, toward the wall member 306. The projections 318 are inserted in a guide groove (guide means) 320 which is formed in the wall member 306 generally parallel with the movement locus of pods 110 and the stages 112.

The above-configured pod transport mechanism 118b serves to not only transport pods 110 between the loading port 114 and the top storage 250 but also store pods 110 in the case 111. The vertical moving mechanism 300 of the pod transport mechanism 118b is configured so as to be able to exchange a pod 110 with the top storage 250.

In the following description, it is assumed that operation of each of the apparatus, devices, etc. constituting the substrate processing apparatus 100 is controlled by the controller 240. In the above-configured vertical moving mechanism 300, drive power from the drive source 310 is transmitted to the support member 304a, whereby the support member 304a is rotated. As a result, the circulation member 302 which is supported by the support member 304a is circulated and the other support members 304a which support the circulation member 302 are also rotated. As the circulation member 302 circulates, the first link members 312 and the second link members 314 which are linked to the circulation member 302 move (circle) together with the circulation member 302, whereby the first link members 312 and the second link members 314 move the stages 122 which are connected to the circulation member 302.

The stages 122 are moved while being guided as the projections 318 slide in and along the guide groove 320. Therefore, the stages 122 are kept horizontal even during transport. As the stages 122 are moved, the pods 110 are moved so as to circle in the direction indicated by arrows in FIG. 10 or in the direction opposite to it. In this manner, the vertical moving mechanism 300 of the pod transport mechanism 118b moves pods 110 in such a manner that its movement locus has at least a vertical component and they circle around plural rotation centers which are the rotation centers 308 of the respective support members 304.

The circulation direction of the circulation member 302 can be switched by a control that the control section 270 which is connected to the drive source 310 controls the rotation direction of the drive source 310. The apparatus, devices, etc. having the same ones in the first embodiment have not been described in detail by giving the former the same reference symbols as the latter in FIGS. 9 and 10.

FIGS. 11A-11C illustrate how a pod 110 is delivered from the vertical moving mechanism 300 to the horizontal moving mechanism 252 in the fourth embodiment of the invention. In each of FIGS. 11A-11C, the top part is a plan view of the horizontal moving mechanism 252 and the bottom part is a front view of the vertical moving mechanism 300.

As shown in FIG. 11A, before delivery of a pod 110, the control section 270 controls the drive source 310 so that the pod 110 is moved to the highest position of the vertical moving mechanism 300. At this time, the circulation member 302 is circulated clockwise as viewed in FIG. 11A. FIG. 11B shows a state that the pod 110 has been moved to the delivery position.

When the pod 110 has been moved to the delivery position, the control section 270 controls the drive source 260 so that a holding member 262b is moved so as to engage with the holding target member 282 of the pod 110. At this time, the projections 294 of the holding member 262b engage with the cuts 288 (see FIG. 6A) of the holding target member 282 and the holding target member 282 is thereby held by the holding member 262b. At this time, the circulation member 302 is circulated clockwise as viewed in FIG. 11B. This movement direction of the circulation member 302 is opposite to that of the circulation member 254 indicated in FIG. 11A. Alternatively, the movement direction of the circulation member 302 may be made opposite to that of the circulation member 254 by circulating the circulation members 302 and 254 counterclockwise as viewed in FIG. 11B.

When the holding target member 282 has been held by the holding member 262b, the control section 270 controls the drive sources 310 and 260 so that the pod 110 is moved rightward as viewed in FIG. 11C in a state that it is held from above by the holding member 262a (horizontal moving mechanism 252) and supported from below by the stage 122 (vertical moving mechanism 300). At this time, the circulation members 254 and 302 are moved at the same speed in the same direction. From the state of FIG. 11C, the circulation members 254 and 302 are moved in the respective directions indicated by arrows in FIG. 11C, whereby the stage 122 is separated from the bottom surface of the pod 110. The delivery of the pod 110 from the vertical moving mechanism 300 to the horizontal moving mechanism 252 is thus completed.

Figure 12:
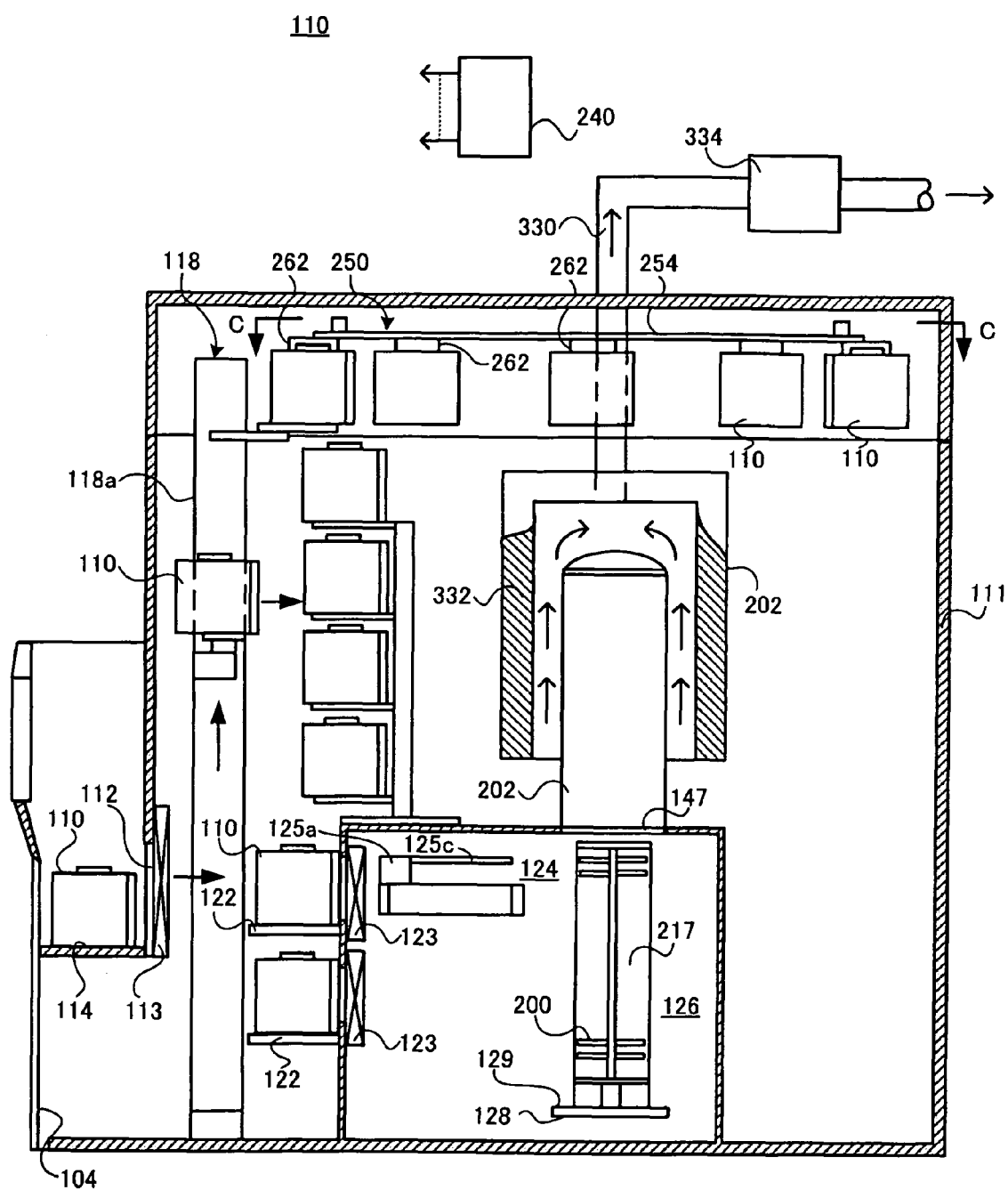
FIG. 12 is a see through side view of a substrate processing apparatus according to a fifth embodiment of the invention.
Figure 13:
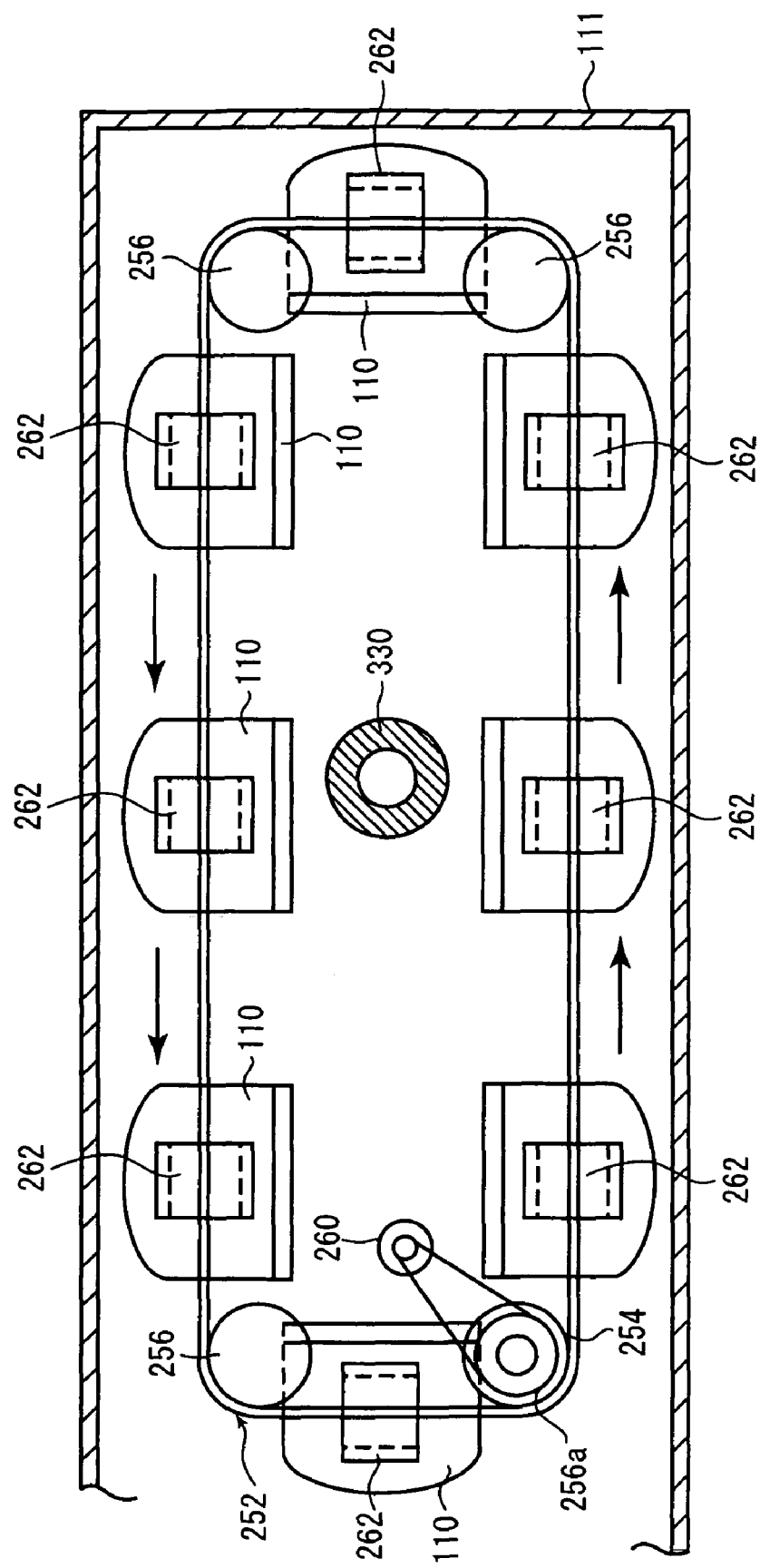
FIG. 13 is a sectional view taken along line C-C in FIG. 12.

FIGS. 12 and 13 show a substrate processing apparatus 100 according to a fifth embodiment of the invention. The substrate processing apparatus 100 according to the fifth embodiment is different in configuration from that according to the third embodiment in that a duct (heat exhaust duct) 330 for exhausting from the case 111 is added.

The duct 330 is connected to a heating unit 332 which is disposed in such a manner that its bottom portion surrounds the processing furnace 202. The duct 330 penetrates through and projects from the case 111, and its end portion, opposite to the end portion connected to the heating unit 332, is connected to a radiator 334 which serves as a cooling means. In the case 111, the duct 330 is disposed so as to avoid the top storage 250.

In the fifth embodiment, heat generated by the heating unit 332 goes up to the radiator 334 through the duct 330 and air that has been cooled by the radiator 334 is discharged from it. In the fifth embodiment, since the duct 330 is disposed so as to avoid the top storage 250, it can be disposed straightly right above the heating unit 332 and hence heat can be exhausted efficiently from the case 111. Therefore, the inside of the heating unit 332 can be cooled efficiently.

The invention includes the following apparatus and methods.

(1) A substrate processing apparatus comprising:
a processing furnace for processing substrates;
an entrance and exit place which is used for carrying a container containing a substrate or substrates into and out of a substrate processing apparatus body;
a transport mechanism for transporting the container at least from the entrance and exit place; and
a storage capable of exchanging the container with the transport mechanism, for storing containers, the storage being disposed above the processing furnace in such a manner that at least part of the storage overlaps with the processing furnace in a direction of gravity.

(2) The substrate processing apparatus according to item (1), wherein the storage comprises a horizontal moving mechanism for moving the container in such a manner that a movement locus of the container has at least a horizontal component and the container circles around plural rotation centers.

(3) The substrate processing apparatus according to item (1), wherein the transport mechanism comprises a vertical moving mechanism for moving the container in such a manner that a movement locus of the container has at least a vertical component and the container circles.

(4) The substrate processing apparatus according to item (2), wherein the horizontal moving mechanism moves the container at least in a longitudinal direction of the substrate processing apparatus body.

(5) The substrate processing apparatus according to item (4), wherein the entrance and exit place, the transport mechanism, and the processing furnace are arranged in this order in the longitudinal direction of the substrate processing apparatus body.

(6) The substrate processing apparatus according to item (1), wherein the storage comprises a delivering unit for exchanging the container with the transfer mechanism at a position between adjoining rotation centers as the container moves.

(7) The substrate processing apparatus according to item (1), wherein a length of the storage in a longitudinal direction of the substrate processing apparatus body is such as to accommodate at least two containers.

(8) The substrate processing apparatus according to item (1), wherein a length of the storage in a direction perpendicular to a longitudinal direction of the substrate processing apparatus body is such as to accommodate at least one container.

(9) The substrate processing apparatus according to item (1), wherein the storage is disposed above the processing furnace so as to stride the processing furnace from a side of a first wall of the substrate processing apparatus body adjacent to which the entrance and exit place is disposed to a side of a second wall of the substrate processing apparatus body that is opposed to the first wall.

(10) The substrate processing apparatus according to item (3), wherein the vertical moving mechanism moves the container in such a manner that the container circles around plural rotation centers.

(11) A substrate processing apparatus comprising:
a substrate processing apparatus body generally having a rectangular parallelepiped shape;
an entrance and exit place which is used for carrying a container containing a substrate or substrates into and out of the substrate processing apparatus body;
a storage for storing containers in the substrate processing apparatus body, the storage comprising a horizontal moving mechanism for moving container at least in a longitudinal direction of the substrate processing apparatus body in such a manner that a movement locus of the container has at least a horizontal component and the container circles around plural rotation centers; and
a transport mechanism for transporting the container between the entrance and exit place and the storage.

(12) The substrate processing apparatus according to item (11), further comprising a processing furnace for processing substrates, wherein the storage is disposed above the processing furnace in such a manner that at least part of the storage overlaps with the processing furnace in a direction of gravity.

(13) The substrate processing apparatus according to item (1) or (11), further comprising a duct for exhausting from the processing furnace, wherein the storage is disposed so as to avoid the duct.

(14) The substrate processing apparatus according to item (13), wherein the duct is a heat exhaust duct for exhausting gas that has been heated in the processing furnace.

(15) The substrate processing apparatus according to item (1) or (11), wherein one of the storage and the transport mechanism comprises a bottom support member for supporting the container from below in the direction of gravity and the other comprises a top support member for holding the container from above in the direction of gravity.

(16) The substrate processing apparatus according to item (1) or (11), wherein:

the storage comprises a horizontal moving mechanism for moving the container in such a manner that a movement locus of the container has at least a horizontal component and the container circles around plural rotation centers; and the transport mechanism comprises a vertical moving mechanism for moving the container in such a manner that a movement locus of the container has at least a vertical component and the container circles, the substrate processing apparatus further comprising:

a control section for controlling the horizontal moving mechanism and the vertical moving mechanism so that they move the container in the same direction while they both support or hold the container.

(17) The substrate processing apparatus according to item 16, wherein the control section controls the horizontal moving mechanism and the vertical moving mechanism so that they move the container in opposite directions when the container is delivered from one of the horizontal moving mechanism and the vertical moving mechanism to the other.

(18) The substrate processing apparatus according to item (1) or (11), wherein the container can accommodate plural substrates and comprises a sealing member for sealing the container.

(19) The substrate processing apparatus according to item (1) or (11), wherein the storage can be removed from the substrate processing apparatus body.

(20) A manufacturing method of a semiconductor device, comprising the steps of:

transporting a container containing plural substrates with a transport mechanism from an entrance and exit place which is used for carrying the container into and out of a substrate processing apparatus body;

delivering the container from the transport mechanism to a storage for storing containers, the storage being disposed above a processing furnace for processing substrates in such a manner that at least part of the storage overlaps with the processing furnace in a direction of gravity;

delivering the container from the storage to the transport mechanism;

taking the substrates out of the container;

carrying the substrates into the processing furnace; and processing the substrates with the processing furnace.

(21) A semiconductor device manufacturing method for manufacturing a semiconductor device using the substrate processing apparatus according to item (1), comprising the steps of:

transporting a container from the entrance and exit place to the transport mechanism;

delivering the container from the transport mechanism to the storage;

delivering the container from the storage to the transport mechanism;

taking a substrate or substrates out of the container;

carrying the substrate or substrates into the processing furnace; and processing the substrate or substrates with the processing furnace.

As described above, the invention can be applied to a substrate processing apparatus for processing substrates such as semiconductor wafers and a manufacturing method of a semiconductor device.

What is claimed is:

1. A substrate processing apparatus comprising:

a processing furnace for processing substrates;

an entrance and exit place which is used for carrying a container containing a substrate or substrates into and out of a substrate processing apparatus body;

transport mechanism for transporting the container at least from the entrance and exit place;

storage capable of exchanging the container with the transport mechanism, for storing containers, the storage being disposed above the processing furnace in such a manner that at least part of the storage overlaps with the processing furnace in a direction of gravity;

a rotary pod rack;

a transfer room disposed below the processing furnace and the rotary pod rack so as to overlap in a direction of gravity the processing furnace and the rotary pod rack; and a horizontal moving mechanism disposed above the processing furnace, the rotary pod rack, and the transfer room so as to overlap in a direction of gravity the processing furnace, the rotary pod rack, and the transfer room.

2. The substrate processing apparatus according to claim 1, wherein the storage comprises a horizontal moving mechanism for moving the container in such a manner that a movement locus of the container has at least a horizontal component and the container circles around plural rotation centers.

3. The substrate processing apparatus according to claim 2, wherein the horizontal moving mechanism moves the container at least in a longitudinal direction of the substrate processing apparatus body.

4. The substrate processing apparatus according to claim 3, wherein the entrance and exit place, the transport mechanism, and the processing furnace are arranged in this order in the longitudinal direction of the substrate processing apparatus body.

5. The substrate processing apparatus according to claim 1, wherein the transport mechanism comprises a vertical moving mechanism for moving the container in such a manner that component and the container circles.

6. The substrate processing apparatus according to claim 5, wherein the vertical moving mechanism moves the container in such a manner that the container circles around plural rotation centers.

7. The substrate processing apparatus according to claim 1, wherein the storage comprises a delivering unit for exchanging the container with the transfer mechanism at a position between adjoining rotation centers as the container moves.

8. The substrate processing apparatus according to claim 1, wherein a length of the storage in a longitudinal direction of the substrate processing apparatus body is such as to accommodate at least two containers.

9. The substrate processing apparatus according to claim 1, wherein a length of the storage in a direction perpendicular to a longitudinal direction of the substrate processing apparatus body is such as to accommodate at least one container.

10. The substrate processing apparatus according to claim 1, wherein the storage is disposed above the processing furnace so as to stride the processing furnace from a side of a first wall of the substrate processing apparatus body adjacent to which the entrance and exit place is disposed to a side of a second wall of the substrate processing apparatus body that is opposed to the first wall.

11. The substrate processing apparatus according to claim 1, wherein one of the storage and the transport mechanism comprises a bottom support member for supporting the comprises a top support member for holding the container from above in the direction of gravity.

12. The substrate processing apparatus according to claim 1, wherein:
the storage comprises a horizontal moving mechanism for moving the container in such a manner that a movement locus of the container has at least a horizontal component and the container circles around plural rotation centers; and
the transport mechanism comprises a vertical moving mechanism for moving the container in such a manner that a movement locus of the container has at least a vertical component and the container circles, the substrate processing apparatus further comprising:
a control section for controlling the horizontal moving mechanism and the vertical moving mechanism so that they move the container in the same direction while they both support or hold the container.

13. The substrate processing apparatus according to claim 12, wherein the control section controls the horizontal moving mechanism and the vertical moving mechanism so that they move the container in opposite directions when the container is delivered from one of the horizontal moving mechanism and the vertical moving mechanism to the other.

14. The substrate processing apparatus according to claim 1, wherein the container can accommodate plural substrates and comprises a sealing member for sealing the container.

15. The substrate processing apparatus according to claim 1, wherein the storage can be removed from the substrate processing apparatus body.

16. A semiconductor device manufacturing method for manufacturing a semiconductor device using the substrate processing apparatus according to claim 1, comprising the steps of:
transporting a container from the entrance and exit place to the transport mechanism;
delivering the container from the transport mechanism to the storage;
delivering the container from the storage to the transport mechanism;
taking a substrate or substrates out of the container;
bringing the substrate or substrates into the processing furnace; and
processing the substrate or substrates with the processing furnace.

17. The substrate processing apparatus according to claim 1, wherein the horizontal moving mechanism, the rotary pod rack, and the processing furnace are located within the substrate processing apparatus.

18. The substrate processing apparatus according to claim 1, wherein the horizontal moving mechanism supports and transfers a plurality of containers containing a substrate or substrates from above.

19. The substrate processing apparatus according to claim 1, further comprising:
a duct for exhausting from the process furnace, the duct for exhausting from the process furnace extending through the horizontal moving mechanism.

20. The substrate processing apparatus according to claim 1, further comprising:
a case for confining the substrate processing apparatus, wherein the horizontal moving mechanism, the rotary pod rack, and the processing furnace are located within the case.

21. The substrate processing apparatus according to claim 1, wherein the horizontal moving mechanism is driven by a belt, the belt disposed primarily in a horizontal plane.

22. A manufacturing method of a semiconductor device, comprising the steps of:
transporting a container containing plural substrates with a transport mechanism from an entrance and exit place which is used for carrying the container into and out of a substrate processing apparatus body;
delivering the container from the transport mechanism to a storage for storing containers, the storage being disposed above a processing furnace for processing substrates in such a manner that at least part of the storage overlaps with the processing furnace in a direction of gravity, wherein the substrate processing apparatus body includes a rotary pod rack and a transfer room, the transfer room being disposed below the processing furnace and the rotary pod rack so as to overlap in a direction of gravity the processing furnace and the rotary pod rack; and
a horizontal moving mechanism, the horizontal moving mechanism being disposed above the processing furnace, the rotary pod rack and the transfer room so as to overlap in a direction of gravity the processing furnace, the rotary pod rack and the transfer room;
delivering the container from the storage to the transport mechanism;
making the substrates out of the container;
carrying the substrates into the processing furnace; and
processing the substrates with the processing furnaces.

* * * * *